United States Patent
Sahu et al.

(10) Patent No.: US 9,281,055 B2
(45) Date of Patent: *Mar. 8, 2016

(54) MEMORY SENSE AMPLIFIER AND COLUMN PRE-CHARGER

(71) Applicant: LSI Corporation, San Jose, CA (US)

(72) Inventors: Rahul Sahu, Bangalore (IN); Dharmendra Kumar Rai, Bangalore (IN)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 60 days.

This patent is subject to a terminal disclaimer.

(21) Appl. No.: 14/217,609

(22) Filed: Mar. 18, 2014

(65) Prior Publication Data

US 2015/0269990 A1  Sep. 24, 2015

(51) Int. Cl.
*G11C 11/419* (2006.01)
*G11C 11/4091* (2006.01)
*G11C 7/12* (2006.01)

(52) U.S. Cl.
CPC ............... *G11C 11/419* (2013.01); *G11C 7/12* (2013.01); *G11C 11/4091* (2013.01)

(58) Field of Classification Search
CPC ........ G11C 11/419; G11C 11/41; G11C 7/12; G11C 11/413; G11C 7/08; G11C 7/065; G11C 7/067
See application file for complete search history.

(56) References Cited

U.S. PATENT DOCUMENTS

| | | | |
|---|---|---|---|
| 8,467,257 B1 * | 6/2013 | Liu et al. | 365/196 |
| 8,830,766 B2 * | 9/2014 | Sahu | 365/189.05 |
| 2005/0281106 A1 * | 12/2005 | Han et al. | 365/205 |
| 2011/0149667 A1 * | 6/2011 | Hamzaoglu et al. | 365/203 |
| 2013/0155758 A1 * | 6/2013 | Liu et al. | 365/154 |
| 2015/0131368 A1 * | 5/2015 | Adams et al. | 365/156 |

* cited by examiner

*Primary Examiner* — Vanthu Nguyen
*Assistant Examiner* — Jerome Leboeuf
(74) *Attorney, Agent, or Firm* — Hamilton DeSanctis & Cha (57) ABSTRACT

A memory includes a number of storage elements connected to a pair of bit-lines, a bit-line pre-charging circuit, a sense amplifier connected to the pair of bit-lines through a column-select switch, a transition detection circuit connected to an output of the sense amplifier, and a local pre-charge control circuit connected to the transition detection circuit and having a local pre-charge control signal output connected to the bit-line pre-charging circuit.

20 Claims, 4 Drawing Sheets

MEMORY SENSE AMPLIFIER AND COLUMN PRE-CHARGER

FIELD OF THE INVENTION

Various embodiments of the present invention provide systems and methods for a local sense amplifier and column pre-charger for a memory.

BACKGROUND

In a memory such as a static random access memory (SRAM), the pre-charging of the internal nodes of the sense amplifier and bit-lines is started only after the successful read operation and subsequent proper latching of the read data, as controlled by conventional tracking schemes and margins. The pre-charge signals are generated in a global control block, with the pre-charge signal running the width of the memory. As the width or number of bits of the memory increases the RC (Resistive-Capacitive) delay for the set of bit-lines in the last column eventually dominates the cycle time of the memory.

SUMMARY

Various embodiments of the present invention provide systems and methods for a local sense amplifier and column pre-charger for a memory.

In some embodiments, a memory includes a number of storage elements connected to a pair of bit-lines, a bit-line pre-charging circuit, a sense amplifier connected to the pair of bit-lines through a column-select switch, a transition detection circuit connected to an output of the sense amplifier, and a local pre-charge control circuit connected to the transition detection circuit and having a local pre-charge control signal output connected to the bit-line pre-charging circuit.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Embodiments of the present invention are related to local sense amplification and column precharging for a memory such as, but not limited to, a static random access memory (SRAM). While static random access memory has been described in various embodiments of the invention, the invention is not limited thereto. Any suitable form of memory is contemplated to be within the scope of the invention, including but not limited to flash memory and programmable read only memory. Memory such as static random access memory (SRAM) is used in many electronic applications requiring data storage, such as in the internal cache memory of a microprocessor. Static random access memory generally includes a number of storage elements and circuitry to read and write digital bit values to the storage elements. The storage elements are connected to read and write circuitry by wires called bit-lines. Storage elements indicate the stored bit value to the read circuitry by causing the voltage on the bit-lines to change, or slew, between rail voltage levels.

In order to avoid the unacceptably long delays created by waiting for a simple storage element to cause a full rail-to-rail voltage slew on a bit-line, a column of the static random access memories includes a pair of bit-lines which slew apart, and a differential amplifier, or sense amplifier. The sense amplifier amplifies the voltage difference between the bit-lines after only a partial slew on the bit-lines, without waiting for a full rail-to-rail slew. The sense amplifier compares the two bit-lines and can determine which has a larger voltage when there are only very small voltage differences between them.

The bit-lines are pre-charged to a logic high state to increase speed, because it can be faster for a sense amplifier to pull a bit-line down to ground during a read operation than to pull it up to a logic high state. The sense amplifier and column pre-charger disclosed herein includes a local sense amplifier and column pre-charge control circuit to locally control pre-charging based on a global pre-charge signal. While the global pre-charge signal can be generated based on any tracking schemes and margins in any suitable manner, by generating a local pre-charge signal based in part on the global pre-charge signal and in part on detected transitions in the column output, the sense amplifier and bit-lines can be pre-charged quickly while ensuring successful reading of data across PVT (Process, Voltage and Temperature) corners. This helps in improving the cycle time of the memory across the PVT corners and also reduces both dynamic and peak power usage. The local pre-charge signal is not required to have any margin with respect to data latching, and thus provides margin-free local pre-charging. In other words, because a transition detection based on the pair of output signals triggers the local pre-charge signal, there is no need to maintain any particular timing margin between the pair of output signals and the start of the pre-charge. Without the local pre-charge control, initiating the pre-charging of the sense amplifier internal nodes and bit-lines when the read data is latched with sufficiently safe margin across the PVT corners is very difficult. Margins must be established that guarantee proper operation, but at the risk of reducing memory performance. However, with the local pre-charge control, this margin is no longer needed. Furthermore, by triggering the sense amplifier reset and pre-charge signal locally based on read data, no margin need be controlled between sense amplifier reset and pre-charge start with respect to the output latch clock, and the sense amplifier will be ready in less time for the next read, improving performance and cycle time.

The local pre-charge control also provides staggered activation of pre-charging of sense amplifier and bit-lines which reduces peak current substantially. The sense amplifier and column pre-charger disclosed herein also provides an integrated read sense circuit and integrated read sensed state latch. A local sense amplifier reset circuit staggers sense amplifier resetting across I/O's (Inputs/Outputs), reducing peak power consumption and reducing the effect of variation across I/O's.

Figure 1:
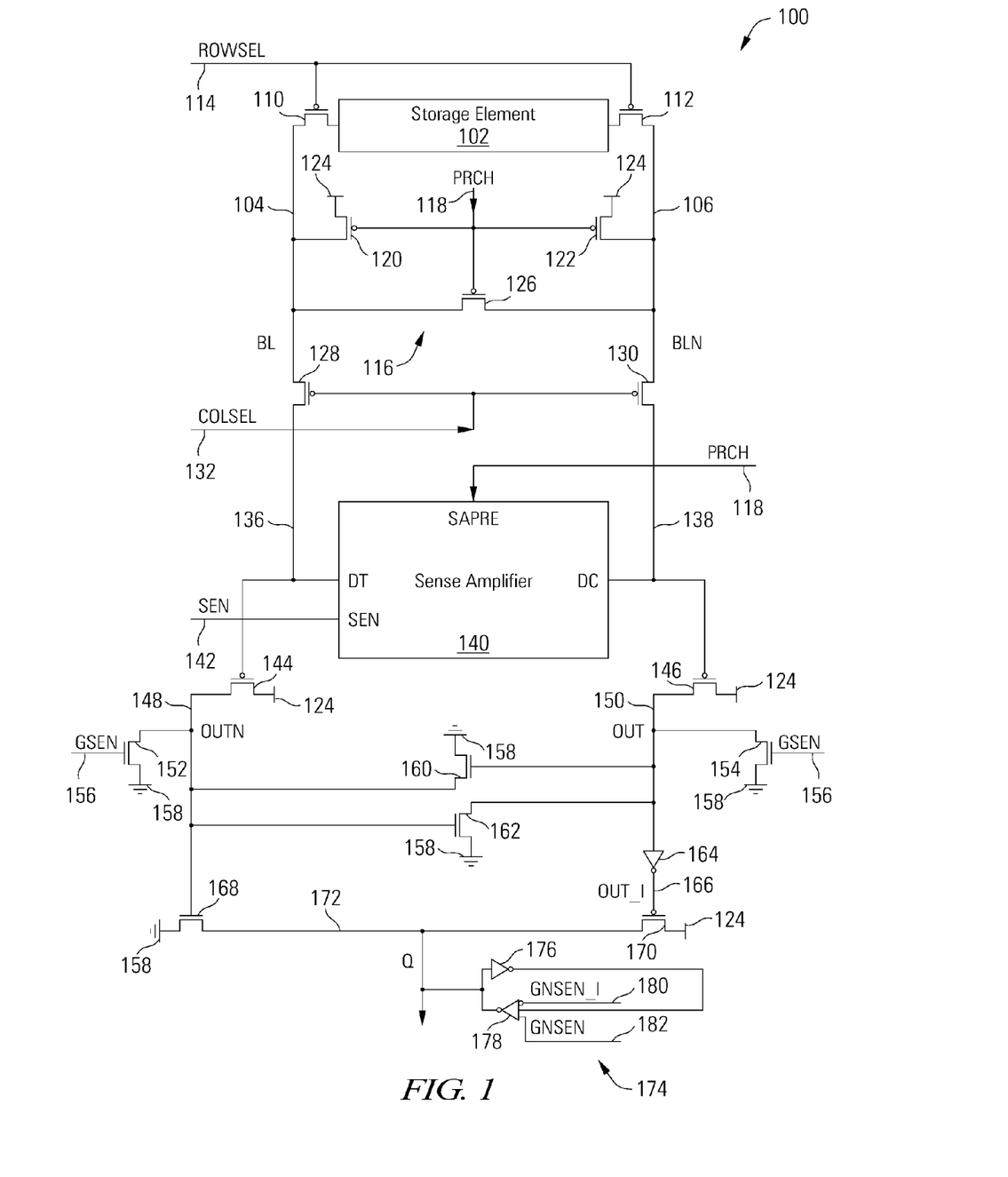
FIG. 1 depicts a static random access memory with local sense amplifier and column pre-charge control in accordance with some embodiments of the present invention.

Turning to FIG. 1, a portion of a column in a static random access memory 100 with local sense amplifier and column pre-charge control is depicted in accordance with some embodiments of the present invention. A memory can include a two-dimensional array of memory cells organized in columns and rows, with each column and row being addressable using a row select signal 114 (or word line) and a column select signal 132. A sense amplifier 140 can be shared by all the storage elements (e.g., 102) connected to bit-lines BL 104 and BLN 106 in a column to amplify the voltage difference between the bit-lines BL 104 and BLN 106 during a read operation. A bit-line pre-charge switch 116 can also be used to pre-charge the bit-lines BL 104 and BLN 106 for the entire column, pulling them up to power 124 during a pre-charge period and, in some cases, equalizing the voltages on the bit-lines BL 104 and BLN 106.

A storage element 102 maintains a bit value during operation until overwritten. The storage element 102 can be any circuit suitable for maintaining a bit value, such as, but not limited to, a cross-coupled inverter pair connected to bit-lines BL 104 and BLN 106 through transistors 110, 112, which are controlled by the row select signal 114. Based upon the disclosure provided herein, one of ordinary skill in the art will recognize a variety of circuits that can be used as a storage element.

A bit-line pre-charge switch 116, controlled by a local pre-charge signal PRCH 118, includes a pair of pullup transistors 120, 122 connected between power 124 and bit-lines BL 104 and BLN 106. The pullup transistors 120, 122 pull bit-lines BL 104 and BLN 106 up to pre-charge them when the local pre-charge signal PRCH 118 is asserted low. In some embodiments, the bit-line pre-charge switch 116 also includes an equalizing transistor 126 connected between bit-lines BL 104 and BLN 106 that reduces the voltage difference between bit-lines BL 104 and BLN 106 when the local pre-charge signal PRCH 118 is asserted low.

A column select signal 132 controls a pair of column select transistors 128, 130 connected between bit-lines BL 104 and BLN 106 and internal nodes DT 136 and DC 138 of the sense amplifier 140. When the column select signal 132 is asserted low, column select transistors 128, 130 will be on and whichever of the storage elements (e.g., 102) is connected to the bit-lines BL 104 and BLN 106 by its row select signal (e.g., 114) will be connected to the internal nodes DT 136 and DC 138 of the sense amplifier 140 through column select transistors 128, 130.

The sense amplifier 140 is pre-charged to an equalized, high voltage under the control of a local pre-charge signal PRCH 118. When connected to the bit-lines BL 104 and BLN 106, and as controlled by a local sense signal SEN 142, the sense amplifier 140 amplifies the differential voltage on internal nodes DT 136 and DC 138 to a full swing voltage differential. The internal nodes DT 136 and DC 138 control pullup transistors 144, 150 to pull one side of output pair OUT 150 and OUTN 148 up to power 124.

Pulldown transistors 152, 154 are connected between each side of output pair OUT 150 and OUTN 148 and ground 158, and are used to discharge output pair OUT 150 and OUTN 148 under control of global sense signal GSEN 156 during certain phases of operation. Cross-coupled transistors 160, 162 are connected between each side of output pair OUT 150 and OUTN 148 and ground 158, with one transistor 160 controlled by OUT 150 and the other transistor 162 controlled by OUTN 148, so that if one side of output pair OUT 150 and OUTN 148 rises to a high state, the other side is pulled to ground 158 and kept low.

An inverter 164 inverts OUT 150, yielding OUT_I 166. A push-pull circuit includes pullup transistor 170 and pulldown transistor 168 connected to power 124 and ground 158, respectively, with output node Q 172 between them. Pullup transistor 170 is controlled by OUT_I 166, and pulldown transistor 168 is controlled by OUTN 148.

The state of output node Q 172 is stored in controlled output latch 174, consisting of cross-coupled inverter 176 and tri-stated inverter 178. The controlled output latch 174 can be disabled by a low state on GNSEN signal 182 and a high state on GNSEN_I signal 180.

Figure 2:
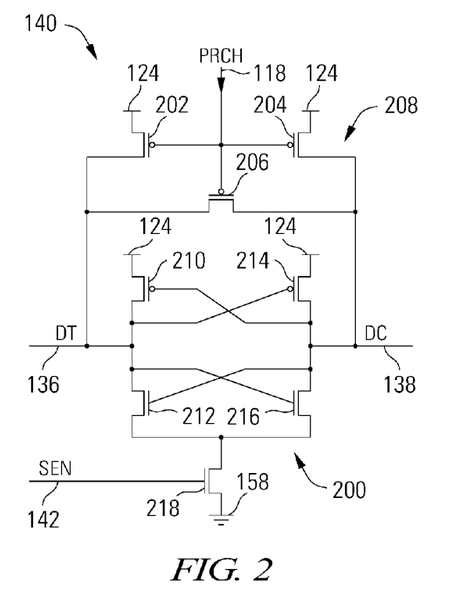
FIG. 2 depicts a sense amplifier in the static random access memory of FIG. 1 in accordance with some embodiments of the present invention.

Turning to FIG. 2, a latch type sense amplifier 140 in the static random access memory 100 of FIG. 1 is depicted in accordance with some embodiments of the present invention. The sense amplifier 140 used in the static random access memory 100 is not limited to the embodiment disclosed in FIG. 2, and any other differential amplifier that can be disabled by the local sense signal 142 can be used. Based upon the disclosure provided herein, one of ordinary skill in the art will recognize a variety of differential amplifiers that can be used to implement the static random access memory 100.

The internal nodes DT 136 and DC 138 in the sense amplifier 140 can be pre-charged by pre-charging switch 208, controlled by local pre-charge signal PRCH 118. The pre-charging switch 208 includes a pair of pullup transistors 202, 204 connected between power 124 and internal nodes DT 136 and DC 138. The pullup transistors 202, 204 pull internal nodes DT 136 and DC 138 up to pre-charge them when the local pre-charge signal PRCH 118 is asserted low. In some embodiments, the pre-charging switch 208 also includes an equalizing transistor 206 connected between internal nodes DT 136 and DC 138 that reduces the voltage difference between internal nodes DT 136 and DC 138 when the local pre-charge signal PRCH 118 is asserted low.

The latching amplifier between internal nodes DT 136 and DC 138 includes cross-coupled inverters comprising pullup transistor 210 and pulldown transistor 212 connected between power 124 and sense enable transistor 218, and pullup transistor 214 and pulldown transistor 216 connected between power 124 and sense enable transistor 218. Internal node DT 136 controls the inverter including transistors 214, 216, and internal node DC 138 controls the inverter including transistors 210, 212. Sense enable transistor 218 is connected between the latching amplifier and ground 158, enabling the latching amplifier when the local sense signal 142 is asserted.

Figure 3:
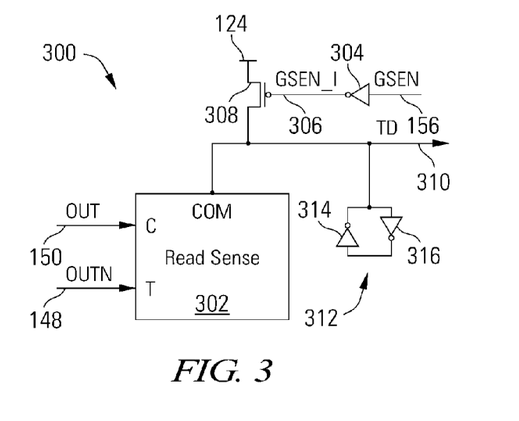
FIG. 3 depicts a transition detection circuit in the static random access memory of FIG. 1 in accordance with some embodiments of the present invention.

Turning to FIG. 3, a transition detection circuit 300 in the static random access memory 100 of FIG. 1 is depicted in accordance with some embodiments of the present invention. The transition detection circuit 300 used in the static random access memory 100 is not limited to the embodiment disclosed in FIG. 3. Based upon the disclosure provided herein, one of ordinary skill in the art will recognize a variety of transition detectors that can be used to implement the static random access memory 100. The transition detected signal TD 310 is asserted for a particular period of time when a low to high transition is detected on either the OUT signal 150 or the OUTN signal 148. In some embodiments, the transition detected signal TD 310 is an active low signal.

A read sense circuit 302 pulls its COM output and thus the transition detected signal TD 310 low for a period of time when either the OUT signal 150 (signal C in the read sense circuit 302) or the OUTN signal 148 (signal T in the read sense circuit 302) transitions from low to high. In other words, the read sense circuit 302 generates a low pulse when either the OUT signal 150 or the OUTN signal 148 transitions from low to high.

A pullup transistor 308 is connected between power 124 and the transition detected signal TD 310 pulls up the transition detected signal TD 310 when the global sense signal GSEN 156 is high and the read sense circuit 302 is not pulling the transition detected signal TD 310 low. The global sense signal GSEN 156 is connected to an inverter 304, yielding inverted global sense signal GSEN_I 306 to control pullup transistor 308. A latch 312 maintains the state of transition detected signal TD 310. Latch 312 comprises cross-coupled inverters 314, 316 in some embodiments.

Figure 4:
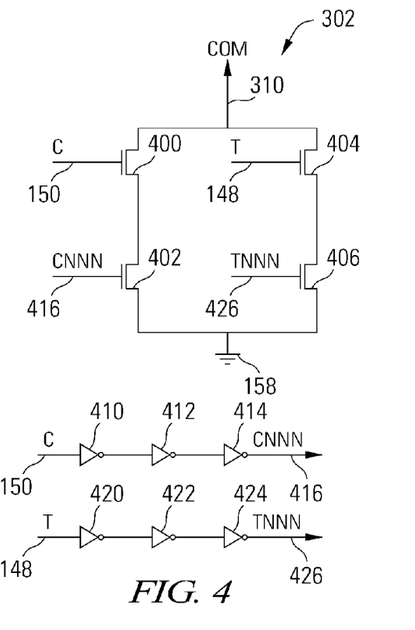
FIG. 4 depicts a read sense circuit in the transition detection circuit of FIG. 3 in accordance with some embodiments of the present invention.

Turning to FIG. 4, a read sense circuit 302 in the transition detection circuit 300 of FIG. 3 is depicted in accordance with some embodiments of the present invention. The read sense circuit 302 used in the transition detection circuit 300 is not limited to the embodiment disclosed in FIG. 4. Based upon the disclosure provided herein, one of ordinary skill in the art will recognize a variety of circuits that can be used to pull an output down for a predetermined period when either of two inputs transitions from low to high.

An inverting delay line comprising an odd-numbered chain of inverters 410, 412, 414 is connected between OUT signal 150 (signal C in the read sense circuit 302) and delayed inverted signal CNNN 416. The delayed inverted signal CNNN 416 thus initially has the inverse state from OUT signal 150 (or signal C). When the OUT signal 150 (or signal C) changes state, the delayed inverted signal CNNN 416 changes state after the inverter delays in the chain of inverters 410, 412, 414, in this example case three inverter delays.

An inverting delay line comprising an odd-numbered chain of inverters 420, 422, 424 is connected between OUTN signal 148 (signal T in the read sense circuit 302) and delayed inverted signal TNNN 426. The delayed inverted signal TNNN 426 thus initially has the inverse state from OUTN signal 148 (or signal T). When the OUTN signal 148 (or signal T) changes state, the delayed inverted signal TNNN 426 changes state after the inverter delays in the chain of inverters 420, 422, 424, in this example case three inverter delays.

Transistors 400, 402 are connected between the COM output (or transition detected signal TD 310) and ground 158, with one controlled by OUT signal 150 (or signal C) and the other controlled by delayed inverted signal CNNN 416. When the OUT signal 150 transitions from low to high, transistors 400, 402 are turned on for the duration of the inverter delays in the chain of inverters 410, 412, 414, pulling the COM output (or transition detected signal TD 310) down to ground 158, and then turning off.

Transistors 404, 406 are also connected between the COM output (or transition detected signal TD 310) and ground 158, with one controlled by OUTN signal 148 (or signal T) and the other controlled by delayed inverted signal TNNN 426. When the OUTN signal 148 transitions from low to high, transistors 404, 406 are turned on for the duration of the inverter delays in the chain of inverters 420, 422, 424, pulling the COM output (or transition detected signal TD 310) down to ground 158, and then turning off. The read sense circuit 302 pulls its COM output and thus the transition detected signal TD 310 low when either the OUT signal 150 (signal C) or the OUTN signal 148 (signal T) transitions from low to high, remaining low for the period established by the delays through the chains of inverters 410, 412, 414 and 420, 422, 424. The delay can be adapted as needed based on the operating characteristics of the static random access memory.

Figure 5:
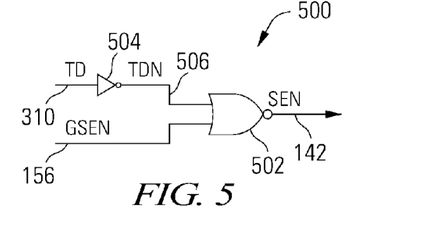
FIG. 5 depicts a local enable circuit for the sense amplifier in the static random access memory of FIG. 1 in accordance with some embodiments of the present invention.

Turning to FIG. 5, a local enable circuit 500 for the sense amplifier 140 in the static random access memory 100 of FIG. 1 is depicted in accordance with some embodiments of the present invention. A NOR gate 502 has two inputs, the global sense signal GSEN 156 and an inverted transition detected signal TDN 506. The inverted transition detected signal TDN 506 is generated by inverter 504 based on transition detected signal TD 310. The NOR gate 502 yields the local sense signal SEN 142. During a pre-charging mode of operation, the global sense signal GSEN 156 and transition detected signal TD 310 are deasserted high, and local sense signal SEN 142 is low. When the global sense signal GSEN 156 is asserted low, the NOR gate 502 pulls local sense signal SEN 142 high. When the local sense signal SEN 142 is high, the static random access memory 100 is placed in a read mode, enabling the sense amplifier 140 and causing a transition in either the OUTN signal 148 or the OUT signal 150. This transition asserts the transition detected signal TD 310 low. After an inverter delay due to inverter 504, the inverted transition detected signal TDN 506 goes high, and the NOR gate 502 pulls local sense signal SEN 142 low.

The local enable circuit 500 thus pulls local sense signal SEN 142 high when the transition detected signal TD 310 has been high and the global sense signal GSEN 156 goes low, and when the transition detected signal TD 310 goes low to indicate that the read value has been latched, the local enable circuit 500 thus pulls local sense signal SEN 142 low again after an inverter delay. This delay can be adapted as needed in various embodiments based on the operating characteristics of the static random access memory.

Figure 6:
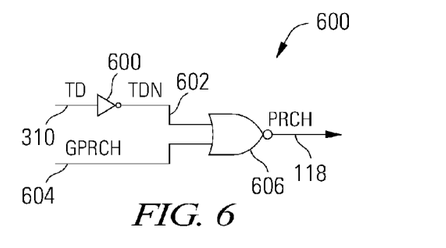
FIG. 6 depicts a local sense amplifier and column pre-charge control circuit in the static random access memory of FIG. 1 in accordance with some embodiments of the present invention.

Turning to FIG. 6, a local sense amplifier and column pre-charge control circuit 600 in the static random access memory 100 of FIG. 1 is depicted in accordance with some embodiments of the present invention. A NOR gate 606 has two inputs, the global pre-charge signal GPRCH 604 and an inverted transition detected signal TDN 602. The inverted transition detected signal TDN 602 is generated by inverter 600 based on transition detected signal TD 310. The global pre-charge signal GPRCH 604 can be generated in a global control circuit for the static random access memory 100 using any of a number of tracking schemes and margins. The NOR gate 606 yields the local pre-charge signal PRCH 118.

During a pre-charging mode of operation, the global pre-charge signal GPRCH 604 is deasserted low and the transition detected signal TD 310 are deasserted high, and local pre-charge signal PRCH 118 is low. When the global pre-charge signal GPRCH 604 is asserted high, the NOR gate 606 pulls local pre-charge signal PRCH 118 high. After the read operation, the transition detected signal TD 310 is asserted low. After an inverter delay due to inverter 600, the inverted transition detected signal TDN 602 goes high, and the NOR gate 606 pulls local pre-charge signal PRCH 118 low.

The local sense amplifier and column pre-charge control circuit 600 thus pulls local pre-charge signal PRCH 118 low until the global pre-charge signal GPRCH 604 goes high, and then pulls local pre-charge signal PRCH 118 high. The local sense amplifier and column pre-charge control circuit 600 leaves the local pre-charge signal PRCH 118 high until the transition detected signal TD 310 goes low to indicate that the read value has been latched based on a transition in an output of the sense amplifier 140, and then it pulls local pre-charge signal PRCH 118 low again after an inverter delay. This delay can be adapted as needed in various embodiments based on the operating characteristics of the static random access memory.

Notably, the output of the sense amplifier 140, from internal nodes DT 136 and DC 138 to output node Q 172, can be implemented in any suitable manner, as long as the transition on the output can be detected to control the local pre-charge signal PRCH 118 and local sense signal SEN 142, or in other words as long as the point at which the sense amplifier output is ready for use can be detected. Such use can include being ready for latching.

Figure 7:
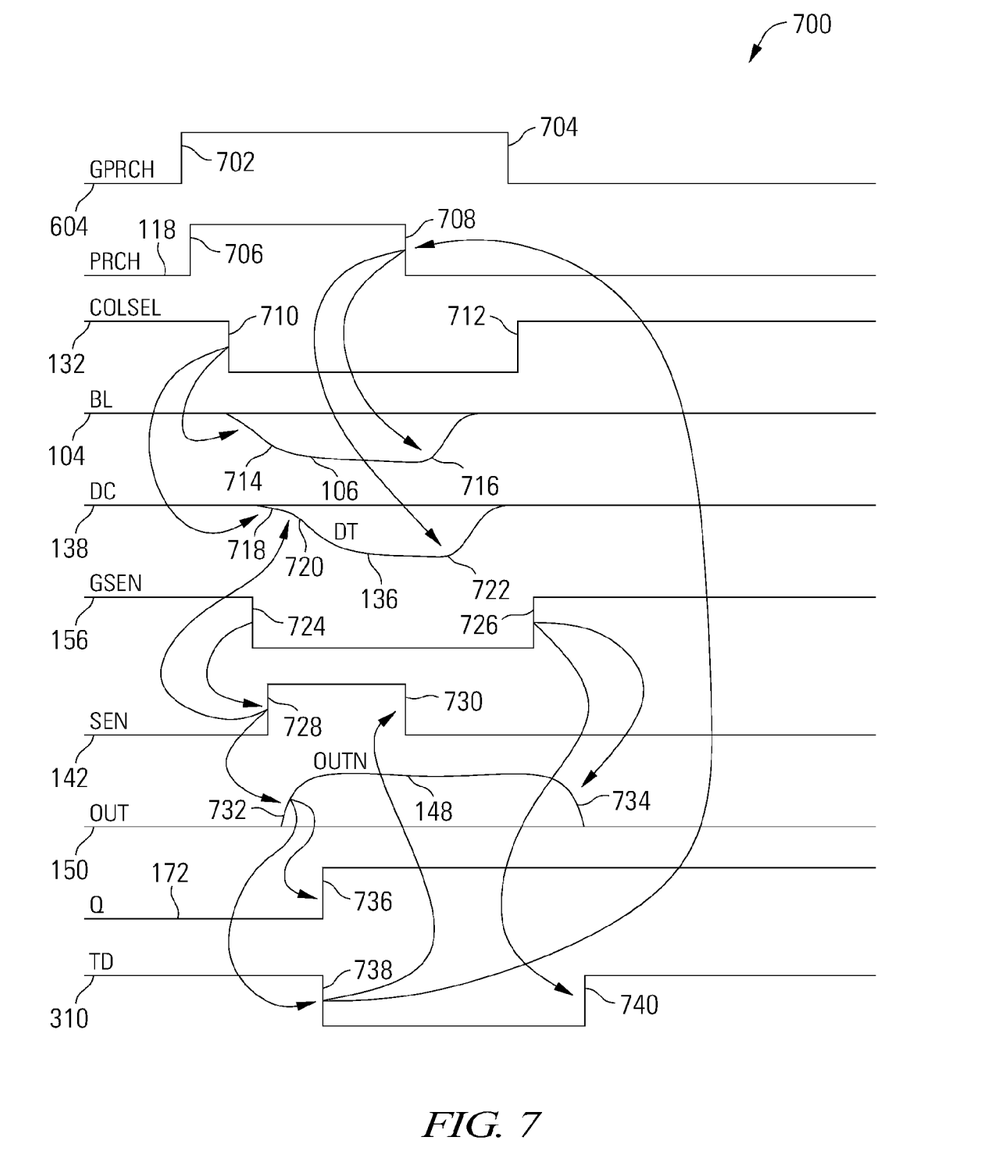
FIG. 7 is a waveform diagram illustrating operation of the static random access memory of FIG. 1 in accordance with some embodiments of the present invention.

The operation of the static random access memory 100 can be understood with reference to the waveforms depicted in FIG. 7. At the end of a pre-charging mode of operation and the beginning of a read operation, the global pre-charge signal GPRCH 604 is deasserted high at transition 702, which turns off pre-charging of the sense amplifier 140 and bit-lines 104, 106. The local pre-charge signal PRCH 118 thus goes high before the bit-lines 104, 106 of the column are selected for the read operation, i.e., before column select signal 132 is asserted low at transition 710. When column select signal 132 is asserted low, the bit-lines 104, 106 start transferring the differential voltage from the selected storage element (e.g., 102) to the internal nodes DT 136 and DC 138 of the sense amplifier 140 at voltage changes 714 and 718. The initial state of transition detected signal TD 310 is high, and output pair OUT 150 and OUTN 148 are both low, because global sense signal GSEN 156 is deasserted high.

When sufficient differential voltage is generated on the bit-lines 104, 106 and internal nodes DT 136 and DC 138 for the sense amplifier 140 to amplify the voltage on internal nodes DT 136 and DC 138 to the correct state, the global sense signal GSEN 156 is asserted low at transition 724, which asserts the local sense signal SEN 142 high at transition 728. The global sense signal GSEN 156 can be controlled by any global control circuit using conventional self-time techniques such as bit-line tracking, etc. When local sense signal SEN 142 is high, the sense amplifier 140 is resolved fully beginning at point 720. In the case in which bit-line BL 104 has a higher voltage and bit-line BLN 106 has a lower voltage, the internal node DT 136 will go low and internal node DC 138 will go high. The global sense signal GSEN 156 low state stops the pre-discharging of the output pair OUT 150 and OUTN 148 through transistors 152, 154. Transistor 144 is on and pulls node OUTN 148 high at point 732 because internal node DT 136 is low, but transistor 146 is off because internal node DC 138 is high. The cross-coupled transistors 158, 160 maintain node OUT 150 in the low state. The controlled latch 174 is disabled by a low state of the GNSEN signal 182.

The push-pull logic of pullup transistor 170 and pulldown transistor 168 drives the Q node 172 high at transition 736. The transition of node OUTN 148 high at point 732 is detected by the transition detection circuit 300, which drives transition detected signal TD 310 low at transition 738, which in turn drives local sense signal SEN 142 low at transition 730, and drives local pre-charge signal PRCH 118 low at transition 708. In other words, the pre-charging of the bit-lines 104, 106 and the sense amplifier 140 is driven by the successful latching of the read data at the output node Q 172.

The global control circuitry, or tracking circuitry, drives global sense signal GSEN 156 high at transition 726 which drives transition detected signal TD 310 high at transition 740 and which pulls down node OUTN 148 at point 734 through transistor 152. The deassertion high of global sense signal GSEN 156 drives transition detected signal TD 310 high at transition 740, ready for the next cycle read operation.

The pre-charging is started locally in static random access memory 100, immediately after the successful read when transition detected signal TD 310 is asserted low at transition 738, which drives local pre-charge signal PRCH 118 low at transition 708. The pre-charging does not need to wait for the assertion of global pre-charge signal GPRCH 604 from global control circuits. This provides a cycle time improvement at the bit-lines 104, 106 from transition 704 of global pre-charge signal GPRCH 604 to transition 708 of local pre-charge signal PRCH 118. Furthermore, because the pre-charging is started in staggered fashion by column when local pre-charge signal PRCH 118 is asserted based on a successful read as detected by transition detected signal TD 310, there will be a significant reduction in peak current and power consumption. There is also a cycle time improvement in the internal nodes DT 136 and DC 138 of the sense amplifier 140, from transition 726 when the global sense signal GSEN 156 is deasserted high to transition 730 when local sense signal SEN 142 is deasserted low.

The local control of the sense amplifier 140 and pre-charging of bit-lines 104, 106 and sense amplifier 140 help start the pre-charge operation in a manner that ensures successful reading of data across the Processes, Voltages and Temperatures, because read data itself triggers the pre-charging operation. The accurate and precise starting of the pre-charge operation helps in improving the operating frequency, resulting in a smaller and more efficient cycle time because of a faster pre-charge operation of the bit-lines 104, 106 and the internal nodes DT 136 and DC 138 of the sense amplifier 140. Because output pair OUT 150 and OUTN 148 trigger the local pre-charge signal PRCH 118 via transition detected signal TD 310, there is no margin involved between output pair OUT 150 and OUTN 148 and the start of the pre-charging.

The transistors used in the static random access memory 100 can be any suitable transistors, such as n-channel or p-channel metal-oxide-semiconductor field-effect (NMOS and PMOS) transistors. Based upon the disclosure provided herein, one of ordinary skill in the art will recognize a variety of transistor types and topologies that can be used to implement the static random access memory 100.

Figure 8:
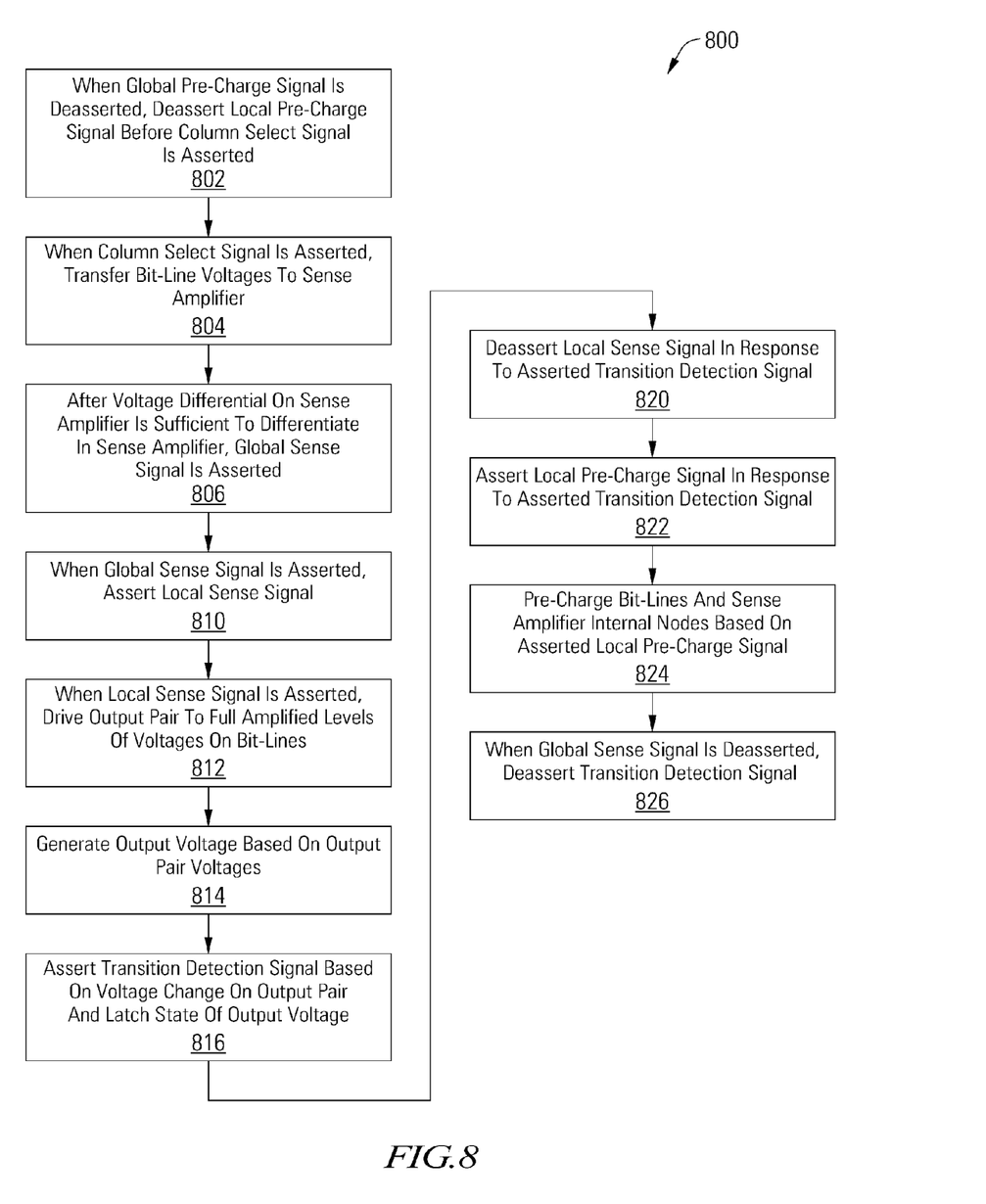
FIG. 8 is a flow diagram showing a method for reading from a memory in accordance with some embodiments of the present invention.

Turning to FIG. 8, a flow diagram 800 shows a method for reading from a memory. Following flow diagram 800, when the global pre-charge signal is deasserted, the local pre-charge signal is deasserted before the column select signal is asserted. (Block 802) When the column select signal is asserted, transfer the bit-line voltages to sense amplifier. (Block 804) After the voltage differential on sense amplifier is sufficient to differentiate in the sense amplifier, the global sense signal is asserted. (Block 806) When the global sense signal is asserted, assert the local sense signal. (Block 810) When the local sense signal is asserted, drive the output pair OUT, OUTN to full amplified levels of voltages on the bit-lines. (Block 812) Generate the output voltage at node Q based on the output pair voltages OUT, OUTN. (Block 814) Assert the transition detection signal based on the voltage change on the output pair OUT, OUTN and latch the state of the output voltage at node Q. (Block 816) Deassert the local sense signal in response to the asserted transition detection signal. (Block 820) Assert the local pre-charge signal in response to the asserted transition detection signal. (Block 822) Pre-charge the bit-lines and sense amplifier internal nodes based on asserted local pre-charge signal. (Block 824) This improves the cycle-time of pre-charging and staggers pre-charging, reducing peak current and power consumption. When the global sense signal is deasserted, deassert the transition detection signal. (Block 826)

It should be noted that the various blocks shown in the drawings and discussed herein can be implemented in integrated circuits along with other functionality. Such integrated circuits can include all of the functions of a given block, system or circuit, or a subset of the block, system or circuit. Further, elements of the blocks, systems or circuits can be implemented across multiple integrated circuits. Such integrated circuits can be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein can be implemented in either software or firmware. In some such cases, the entire system, block or circuit can be implemented using its software or firmware equivalent. In other cases, the one part of a given system, block or circuit can be implemented in software or firmware, while other parts are implemented in hardware.

In conclusion, the present invention provides novel apparatuses and methods for sense amplification and column pre-charging in a memory. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A memory comprising:
   a plurality of storage elements connected to a pair of bit-lines;
   a bit-line pre-charging circuit;
   a sense amplifier connected to the pair of bit-lines through a column-select switch;
   a transition detection circuit connected to an output of the sense amplifier yielding a transition detected signal; and
   a local pre-charge control circuit comprising a first input receiving the transition detected signal, and a second input receiving a global pre-charge signal, the local pre-charge control circuit comprising an output yielding a local pre-charge control signal, wherein the output of the local pre-charge control circuit is connected to the bit-line pre-charging circuit, and wherein the local pre-charge control circuit is operable to assert the output of the local pre-charge control circuit based on both the global pre-charge signal and the transition detected signal being in an asserted state.

2. The memory of claim 1, wherein the sense amplifier comprises an internal node pre-charging circuit controlled by the local pre-charge control signal.

3. The memory of claim 1, wherein the sense amplifier comprises an enable input connected to a local sense signal, wherein the local sense signal is generated based at least in part on the transition detected signal.

4. The memory of claim 3, further comprising a local sense amplifier enable circuit comprising a NOR gate having an output yielding the local sense signal, a first input connected to a global sense signal, and a second input connected to the transition detected signal through an inverter.

5. The memory of claim 1, wherein the local pre-charge control circuit comprises a NOR gate having an output yielding the local pre-charge control signal, a first input connected to a global pre-charge signal and a second input connected to the transition detected signal through an inverter.

6. The memory of claim 1, wherein the transition detection circuit comprises a read sense circuit configured to pull the transition detected signal down for a predetermined period of time when the output of the sense amplifier transitions, and a pullup transistor connected to the transition detected signal to pull up the transition detected signal when a global sense signal is asserted.

7. The memory of claim 6, wherein the read sense circuit comprises a pair of transistors connected between the transition detected signal and a ground, a first of the pair of transistors controlled by the output of the sense amplifier, a second of the pair of transistors controlled by a delayed inverted version of the output of the sense amplifier.

8. The memory of claim 7, wherein the output of the sense amplifier comprises differential signals, wherein the first of the pair of transistors is controlled by a first of the differential signals in the output of the sense amplifier, wherein the second of the pair of transistors is controlled by a delayed inverted version of the first of the differential signals in the output of the sense amplifier, the read sense circuit further comprising a second pair of transistors connected between the transition detected signal and the ground, wherein a first of the second pair of transistors is controlled by a second of the differential signals in the output of the sense amplifier, wherein a second of the pair of transistors is controlled by a delayed inverted version of the second of the differential signals in the output of the sense amplifier.

9. The memory of claim 1, wherein the transition detection circuit further comprises an output state latch.

10. The memory of claim 1, wherein the output of the sense amplifier comprises:
    a pair of differential signals;
    a first pullup transistor connected between a first of the pair of differential signals and power and controlled by a first internal node of the sense amplifier;
    a second pullup transistor connected between a second of the pair of differential signals and power and controlled by a second internal node of the sense amplifier;
    a third pullup transistor connected between an output node and power, controlled by an inverted version of the first of the pair of differential signals; and
    a pulldown transistor connected between the output node and ground, controlled by the second of the pair of differential signals.

11. The memory of claim 10, wherein the output of the sense amplifier further comprises a pre-discharging transistor connected between each of the pair of differential signals and ground and controlled by a global sense signal.

12. The memory of claim 10, wherein the output of the sense amplifier further comprises a first cross-coupled pulldown transistor connected between ground and the first of the pair of differential signals, controlled by the second of the pair of differential signals, and a second cross-coupled pulldown transistor connected between ground and the second of the pair of differential signals, controlled by the first of the pair of differential signals.

13. The memory of claim 10, wherein the output of the sense amplifier further comprises a controlled latch connected to the output node.

14. A method for pre-charging and reading a memory, comprising:
    stopping pre-charging in the memory;
    amplifying bit-line voltages in a sense amplifier to yield a sense amplifier output;
    detecting when the sense amplifier output is ready after the amplifying;
    starting the pre-charging based on the sense amplifier output being ready for use; and
    disabling the sense amplifier based on the sense amplifier output being ready for use.

15. The method of claim 14, wherein pre-charging start times across multiple columns in the memory are staggered based on said detecting when the sense amplifier output is ready.

16. The method of claim 14, wherein detecting when the sense amplifier output is ready comprises detecting a transition on one of a pair of differential output lines that have been pre-discharged.

17. The method of claim 14, wherein the pre-charging is stopped in response to deassertion of a global pre-charge signal.

18. The method of claim 14, further comprising enabling the sense amplifier in response to assertion of a global sense signal.

19. The method of claim 14, further comprising charging a sense amplifier output transition detected signal when a global sense signal is asserted and pulling the sense amplifier output transition detected signal low for a predetermined period after a low to high transition is detected on the sense amplifier output, wherein the pre-charging is started when the sense amplifier output transition detected signal transitions low.

20. A memory comprising:
    a plurality of storage elements connected to a pair of bit-lines;
    a bit-line pre-charge circuit connected to the pair of bit-lines controlled by a local pre-charge signal;
    a sense amplifier comprising a pair of internal nodes connected to the pair of bit-lines through a column-select switch, a pre-charge input connected to the local pre-charge signal, and an enable input connected to a local sense signal;
    a pair of output lines connected to power through a pair of pullup transistors each controlled by one of the pair of internal nodes of the sense amplifier;
    a transition detection circuit connected to the pair of output lines and configured to assert a transition detected signal for a predetermined period of time in response to a transition from low to high on one of the pair of output lines;
    a local enable circuit configured to assert the local sense signal in response to assertion of a global sense signal and to deassert the local sense signal in response to assertion of the transition detected signal; and
    a local pre-charge circuit configured to deassert the local pre-charge signal in response to deassertion of a global pre-charge signal and to assert the local pre-charge signal in response to assertion of the transition detected signal.

* * * * *